United States Patent
Ko et al.

(10) Patent No.: US 6,350,677 B1
(45) Date of Patent: Feb. 26, 2002

(54) METHOD FOR FORMING A SELF-ALIGNED SILICIDE LAYER

(75) Inventors: Joe Ko; Gary Hong, both of Hsinchu (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/630,869

(22) Filed: Aug. 2, 2000

(30) Foreign Application Priority Data

Jul. 24, 2000 (TW) .......................... 89114705 A

(51) Int. Cl.⁷ .......................................... H01L 21/4763
(52) U.S. Cl. ....................................... 438/630; 438/581
(58) Field of Search .................. 438/581, 583, 438/630, 649, 651, 655, 663, 721, 755, 692, 180, 229, 231, 301, 304, 305, 364, 339, 300, 299

(56) References Cited

U.S. PATENT DOCUMENTS

| | | | | |
|---|---|---|---|---|
| 4,683,645 A | * | 8/1987 | Naguib et al. | 438/301 |
| 5,393,676 A | * | 2/1995 | Anjum et al. | 438/630 |
| 5,731,239 A | * | 3/1998 | Wong et al. | 438/296 |
| 5,945,707 A | * | 8/1999 | Bronner et al. | 257/330 |
| 5,976,956 A | * | 11/1999 | Gardner et al. | 438/473 |
| 6,037,204 A | * | 3/2000 | Chang et al. | 438/231 |
| 6,136,655 A | * | 10/2000 | Assaderaghi et al. | 438/289 |
| 6,214,680 B1 | * | 4/2001 | Quick et al. | 438/300 |

* cited by examiner

Primary Examiner—David Nelms
Assistant Examiner—David Nhu
(74) Attorney, Agent, or Firm—Thomas, Kayden, Horstemeyer & Risley

(57) ABSTRACT

A method of forming a self-aligned silicide layer. A planarization process is performed to form a gate with a planar top surface. Due to the planar top surface of the gate, the reactivity and the uniformity of thickness of the subsequently formed silicide layer on the top surface of the gate are improved, such that the resistance of the silicide is reduced, and the performance of the device is improved.

19 Claims, 3 Drawing Sheets

METHOD FOR FORMING A SELF-ALIGNED SILICIDE LAYER

CROSS-REFERENCE TO RELATED APPLICATION

This application claims the priority benefit of Taiwan application serial no. 89114705, filed Jul. 24, 2000.

BACKGROUND OF THE INVENTION

1. Field of the Invention

The present invention relates to a method for forming a semiconductor device. More particularly, the present invention relates to a method for forming a self-aligned silicide layer.

2. Description of the Related Art

When integration of elements in integrated circuits (IC) increases, line widths and geometries for semiconductor devices are reduced. However, resistance of a source/drain region in a metal oxide semiconductor (MOS) transistors increases, and the polysilicon electrodes that form the MOS gates and wiring lines within semiconductor devices introduce undesirable resistance. In order to reduce resistance and RC delay time to improve the operating speed of a device, a self-aligned silicide (salicide) layer is employed. Therefore, a response time or an operating speed of the whole device is increased.

A typical implementation of a silicide layer on a polysilicon electrode or a silicon substrate is known as a self-aligned silicide process. It is employed to reduce semiconductor device resistance. Conventionally, the manufacturing steps for a self-aligned silicide layer are follows as. First, a substrate having an isolation structure is provided, and a gate oxide layer and a doped polysilicon layer are formed on the substrate, respectively. The thickness of the doped polysilicon layer is 1000–3000 Å. The doped polysilicon layer and the gate oxide layer are defined to form a gate, and a lightly doped source/drain region is formed in the substrate by an ion implantation process. A spacer is formed on sidewalls of the gate. The spacer and the gate serve as a mask, and then a heavily doped source/drain region is formed in the substrate by an ion implantation process, wherein the heavily doped source/drain region and the lightly doped source/drain region together form a source/drain region.

A metal layer for forming a silicide layer is deposited over the substrate by sputtering, and then a rapid thermal process is performed. The metal layer only reacts with the gate and the source/drain region to form a silicide layer after performing the thermal process. A portion of the unreacted metal layer is removed by selective wet etching. Since the whole process of forming the silicide layer does not require a photolithography step, the silicide layer formed by the above process is called a self-aligned suicide layer.

Because of the isolation structure, the surface of the substrate is uneven. Therefore, the surface of the polysilicon layer on the substrate is uneven, and the top surface of the subsequently formed gate is also uneven. The thickness of the metal layer on the gate is not uniform, and voids are easily formed between the metal layer and the polysilicon layer. Due to the voids, the contact area between the metal layer and the top surface of the gate is decreased; thus, the number of the nucleation sites is decreased. By the reduction of the nucleation sites, quality of the subsequently formed silicide layer is degraded. As a consequence, sheet resistance of the silicide layer is increased, and the reactivity and the uniformity of thickness of the silicide layer are both affected. Additionally, the performance of the gate is degraded.

SUMMARY OF THE INVENTION

Accordingly, the present invention provides a method for forming a self-aligned silicide layer. The method can improve reactivity and uniformity of thickness of the silicide layer, and reduce sheet resistance of the silicide layer.

To achieve these and other advantages and in accordance with the purpose of the invention, as embodied and broadly described herein, the invention provides a method for forming a self-aligned silicide layer. A gate with a planar top surface is formed to improve reactivity and uniformity of thickness of the silicide formed in the subsequent process, such that the sheet resistance of the silicide layer is reduced. The formation of a self-aligned silicide layer is described as follows. A gate oxide layer is formed on a substrate, and a polysilicon layer is formed on the gate oxide layer. Then, the polysilicon layer is planarized by chemical mechanical polishing. The polysilicon layer and the gate oxide layer are defined to form a gate with a planar top surface. Finally, a silicide layer is formed on the planar top surface of the gate.

The feature of this invention is the formation of a gate with a planar top surface. Due to the planar top surface of the gate, the reactivity and the uniformity of thickness of the subsequently formed silicide layer on the top surface of the gate are improved, such that the resistance of the silicide is reduced, and the performance of the device is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
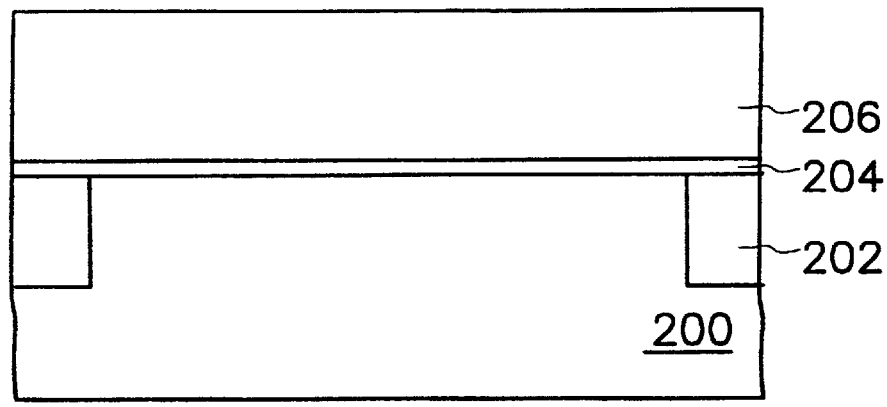
FIGS. 1A through 1G are schematic, cross-sectional views showing the progression of the manufacturing steps for a self-aligned silicide layer in accordance with one preferred embodiment of the present invention.

Reference will now be made in detail to the present preferred embodiments of the invention, examples of which are illustrated in the accompanying drawings. Wherever possible the same reference numbers are used in the drawings and the description to refer to the same or like parts.

FIGS. 1A through 1G are schematic, cross-sectional views showing the progression of the manufacturing steps for a self-aligned silicide layer in accordance with one preferred embodiment of the present invention.

Referring to FIG. 1A, a substrate 200 having an isolation structure 202 is provided, and a gate oxide layer 204 and a polysilicon layer 206 are formed on the substrate 200 in sequence. The gate oxide layer 204 is formed on the substrate 200 by, for example, thermal oxidation. The polysilicon layer 206 made of a material such as doped polysilicon is formed by, for example, chemical vapor deposition (CVD) on the gate oxide layer 204. The thickness of the polysilicon layer 206 is about 3000–6000 Å, and the polysilicon layer 206 is preferably doped to increase the conductivity.

Figure 1B:
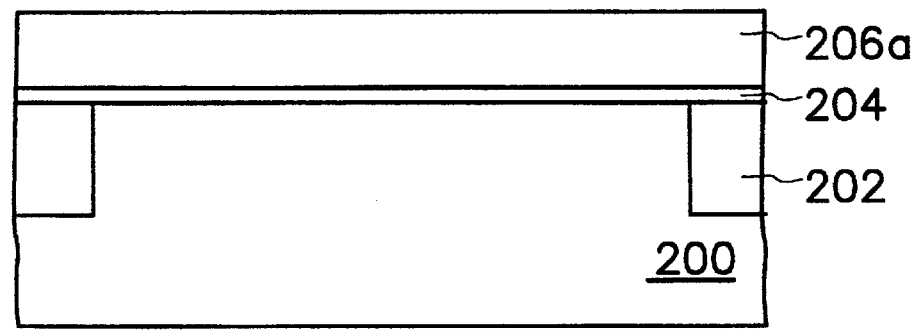

Referring to FIG. 1B, the polysilicon layer 206 is planarized by a process such as chemical mechanical polishing to form a polysilicon layer 206a with a planar surface. The thickness of the polysilicon layer 206a is about 1000–3000 Å.

The surface of the subsequently deposited polysilicon layer on the substrate 200 is uneven because of the uneven surface of the substrate 200; thus, in the conventional art, reactivity and uniformity of thickness of the subsequently formed silicide layer on the polysilicon layer are affected, and quality of the silicide layer is poor. Therefore, in this invention, the polysilicon layer 206 is planarized to obtain an even surface, so that the poor uniformity and the poor reactivity of the silicide layer are avoided.

Figure 1C:
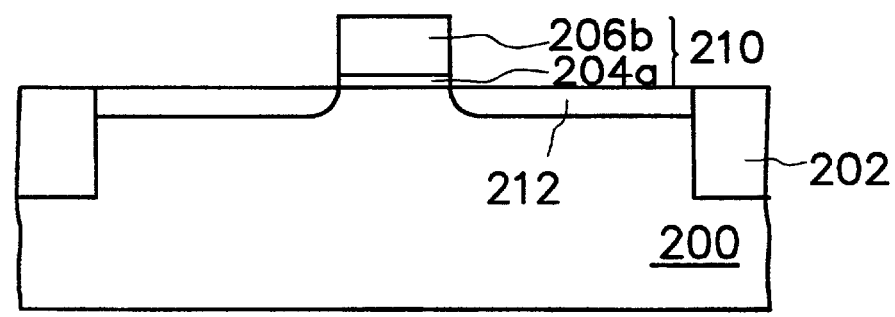

Referring to FIG. 1C, the polysilicon layer 206a and the gate oxide layer 204 are defined by, for example, photolithography and etching to form a gate 210 which is made of a polysilicon layer 206b and a gate oxide layer 204a. The gate 210 serves as an implant mask, and then a lightly doped source/drain region 212 is formed in the substrate 200 by an ion implantation process.

Because the surface of the polysilicon layer 206a is even, a top surface of the gate 210 is even. Hence, the thickness of the subsequently formed metal layer is uniform, and voids between the metal layer and the polysilicon layer are avoided.

Figure 1D:
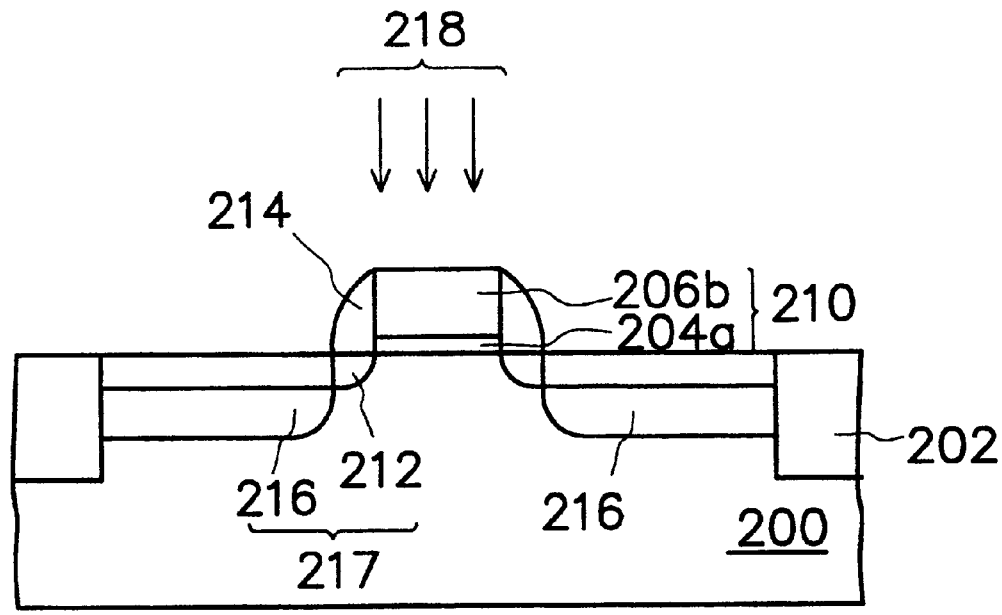

Referring to FIG. 1D, a spacer 214 is formed on sidewalls of the gate 210. The spacer 214 and the gate 210 serve as an implant mask, and then a heavily doped source/drain region 216 is formed in the substrate 200 by an ion implantation process. The lightly doped source/drain region 212 and the heavily doped source/drain region 216 constitute a source/drain region 217.

Next, an annealing step is performed, and then a drive-in process is implemented to diffuse the dopant into a suitable position and make the concentration uniform. The implanting technique is not directly related to the invention and is well known to these skilled in the art, so detailed description is omitted herein.

However, with the reduction of dimensions of a polysilicon gate, the formation of a high-quality silicide layer on the polysilicon gate becomes difficult. Growth of the silicide layer is stunted by the high stress between the silicide layer and the polysilicon layer and/or the small number of nucleation sites. Therefore, quality of the silicide layer deteriorates, sheet resistance of the silicide layer increases, and performance of the gate is compromised. For the formation of a device whose line width is smaller than 0.18 $\mu$m, a pre-amorphization implant (PAI) process is performed to improve the quality of the silicide because the PAI process converts the surface of the polysilicon layer into an amorphous silicon layer in order to increase the number of the nucleation sites. Therefore, the quality of the subsequently formed silicide layer is improved, and sheet resistance of the subsequently formed silicide layer is reduced.

A pre-amorphization implant process 218 is carried out to implant ions into the gate 210 and the source/drain region 217, so that a surface layer of the polysilicon layer 206b and the source/drain region 217 are converted into an amorphous silicon layer (not shown in FIG. 1D). The pre-amorphization implant process 218 bombards the surface of the polysilicon layer 206b to form an amorphous silicon layer; thus, the number of the nucleation sites is increased. Therefore, the quality of a subsequently formed silicide layer on the polysilicon gate 206b and the source/drain region 217 is improved. The amorphization of the polysilicon layer facilitates the formation of a silicide layer in the subsequent process.

Figure 1E:
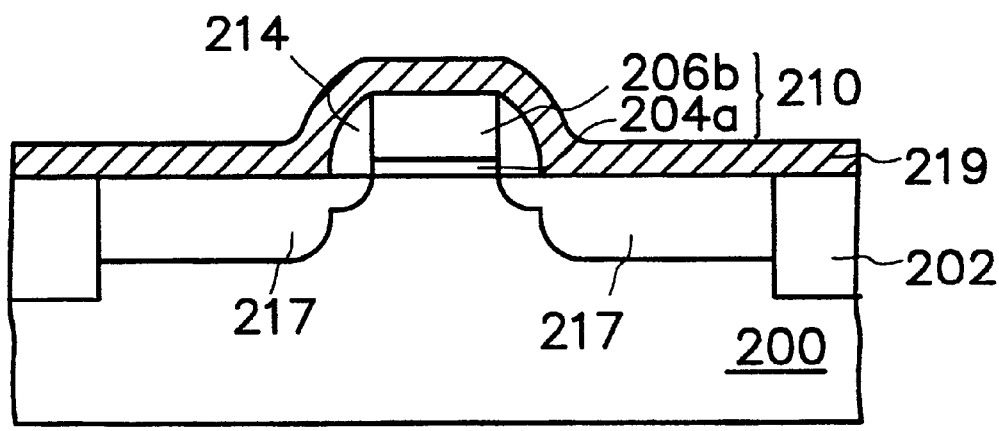

Referring to FIG. 1E, a conformal metal layer 219 is deposited over the substrate 200 by, for example, sputtering. The metal layer 219 is made of a material such as titanium, cobalt, nickel or platinum.

Figure 1F:
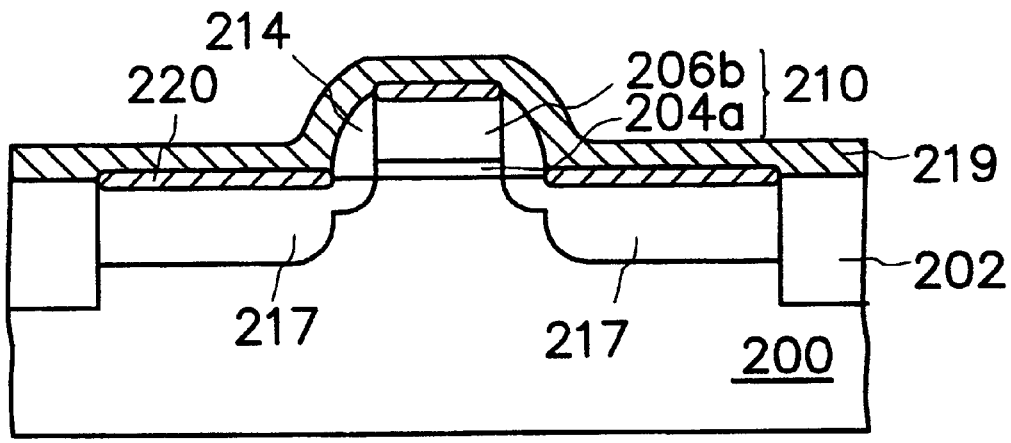

Referring to FIG. 1F, a portion of the metal layer 219 reacts with silicon in the polysilicon layer 206b and silicon in the source/drain region 217 to form a silicide layer 220 by a rapid thermal process.

Figure 1G:
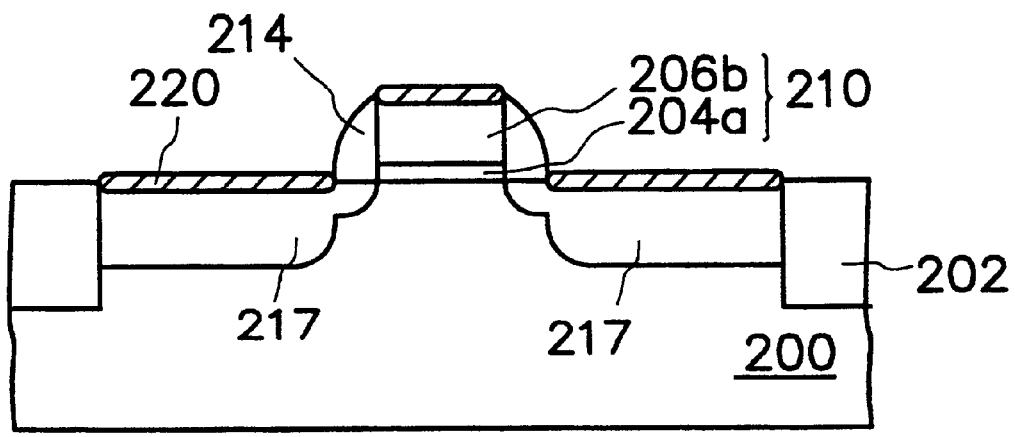

Referring to FIG. 1G, the unreacted metal layer 219 is removed by, for example, wet etching to form the structure shown in FIG. 1G.

The key feature of this invention is to form a gate with a planar top surface. Due to the planar top surface of the gate, the reactivity and the thickness uniformity of the subsequently formed silicide layer on the top surface of the gate are improved, such that the resistance of the silicide is reduced, and the performance of the device is improved.

Additionally, the method is suitable for the formation of NMOS, the formation of PMOS, and the formation of dual gate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a self-aligned silicide layer, comprising the steps of:

providing a substrate having a gate oxide layer;

forming a polysilicon layer on the gate oxide layer;

planarizing the polysilicon layer until a planar top surface of the polysilicon layer is obtained;

patterning the polysilicon layer and the gate oxide layer to form a gate;

forming a lightly doped source/drain region in the substrate with the gate serving as an implant mask;

forming a spacer on sidewalls of the gate;

forming a heavily doped source/drain region in the substrate with the gate and the spacer serving as an implant mask, wherein the lightly doped source/drain region and the heavily doped source/drain region together constitute a source/drain region;

performing a pre-amorphization implant process upon the substrate; and forming a silicide layer on a top surface of the gate and on a surface of the source/drain region.

2. The method of claim 1, wherein a thickness of the polysilicon layer is about 3000–6000 Å.

3. The method of claim 1, wherein the step of planarizing the polysilicon layer includes using chemical mechanical polishing.

4. The method of claim 3, wherein a thickness of the planarized polysilicon layer is about 1000–3000 Å.

5. The method of claim 1, wherein the step of forming the silicide layer further comprises:

forming a metal layer at least covering the planarized polysilicon layer of the gate and the source/drain region;

performing a rapid thermal process upon the substrate;

forming a silicide layer on the planarized polysilicon layer of the gate and the source/drain region; and removing the residual metal layer.

6. The method of claim 1, wherein the silicide layer includes titanium silicide.

7. The method of claim 1, wherein the silicide layer includes cobalt silicide.

8. The method of claim 1, wherein the silicide layer includes nickel silicide.

9. The method of claim 1, wherein the silicide layer includes platinum silicide.

10. A method for forming a silicide layer, which is suitable for a substrate having an gate oxide layer, and a polysilicon layer is on the gate oxide layer, comprising the steps of:

planarizing the polysilicon layer until a planar top surface of the polysilicon layer is obtained;

patterning the polysilicon layer and the gate oxide layer to form a gate;

forming a source/drain region in the substrate;

performing a pre-amorphization implant process upon the substrate; and forming a silicide layer on a top surface of the gate and on a surface of the source/drain region.

11. The method of claim 10, wherein a thickness of the polysilicon layer is about 3000–6000 Å.

12. The method of claim 10, wherein the step of planarizing the polysilicon layer includes using chemical mechanical polishing.

13. The method of claim 12, wherein a thickness of the planarized polysilicon layer is about 1000–3000 Å.

14. The method of claim 10, wherein the step of forming the silicide layer further comprise:

forming a metal layer at least covering the planarized polysilicon layer and the source/drain region;

performing a rapid thermal processing upon the substrate;

forming a silicide layer on the planarized polysilicon layer and the source/drain region; and removing the residual metal layer.

15. The method of claim 10, wherein the silicide layer includes titanium silicide.

16. The method of claim 10, wherein the silicide layer includes cobalt silicide.

17. The method of claim 10, wherein the silicide layer includes nickel silicide.

18. The method of claim 10, wherein the silicide layer includes platinum silicide.

19. The method of claim 10, wherein the step of forming the source/drain region further comprises:

forming a lightly doped source/drain region in the substrate;

forming a spacer on sidewalls of the gate; and forming a heavily doped source/drain region in the substrate, wherein the lightly doped source/drain region and the heavily doped source/drain region constitute a source/drain region.

\* \* \* \* \*